United States Patent [19]
Chen et al.

[11] Patent Number: 5,937,295
[45] Date of Patent: Aug. 10, 1999

[54] NANO-STRUCTURE MEMORY DEVICE

[75] Inventors: Wei Chen, Croton-on-Hudson; Theoren Perlee Smith, III, Shrub Oak; Sandip Tiwari, Ossining, all of N.Y.

[73] Assignee: International Business Machines Corporation, Armonk, N.Y.

[21] Appl. No.: 08/947,283

[22] Filed: Oct. 7, 1997

Related U.S. Application Data

[62] Division of application No. 08/536,510, Sep. 29, 1995, Pat. No. 5,714,766.

[51] Int. Cl.$^6$ .............................................. H01C 21/8247
[52] U.S. Cl. ..................... 438/257; 438/962; 438/261; 438/264
[58] Field of Search .................................. 438/257–267, 438/962

[56] References Cited

U.S. PATENT DOCUMENTS 5,354,707  10/1994  Chapple-Sokol et al. .
5,670,790   9/1997  Katch et al. .

OTHER PUBLICATIONS

Leobandung, et al., Single hole quantum dot transistor in silicon, Appl. Phys. Lett. 67 (16) 2338–40, Oct. 16, 1995.
Tiwari et al. Volatile and Non–Volatile Memories in Silicon with Nano–Crystal Storage, IEEE, Int'l Electron Device Mtg. 95–521, 1995.
Leobandung et al, Observation of quantum effects and Coulomb blockade in silicon quantum–dot transistors at temperatures over 100 K, Appl. Phys. Lett 67 (7) 938–40, Aug. 14, 1995.

*Primary Examiner*—John F. Niebling
*Assistant Examiner*—Jonathan Hack
*Attorney, Agent, or Firm*—Robert M. Trepp

[57] ABSTRACT

A memory device and memory incorporating a plurality of the memory devices is described wherein each memory device has spaced apart source and drain regions, a channel, a barrier insulating layer, a nanocrystal or a plurality of nanocrystals, a control barrier layer, and a gate electrode. The nanocrystal which may be a quantum dot, stores one electron or hole or a discrete number of electrons or holes at room temperature to provide threshold voltage shifts in excess of the thermal voltage for each change in electron or hole stored. The invention utilizes Coulomb blockade in electrostatically coupling one or more stored electrons or holes to a channel while avoiding in-path Coulomb-blockade controlled conduction for sensing the stored charge.

3 Claims, 8 Drawing Sheets

NANO-STRUCTURE MEMORY DEVICE

This is a divisional of application Ser. No. 08/536,510, filed Sep. 29, 1995 now U.S. Pat. No. 5,714,766.

FIELD OF THE INVENTION

This invention relates to semiconductor memories and devices and more particularly, to a semiconductor device nano-structure having a drain, source, channel and a region for storing zero, one, or more electrons whereby the device has a corresponding discrete threshold voltage.

BACKGROUND OF THE INVENTION

As device sizes approach dimensions in the 100 nm range, numerous problems occur in achieving functionality that are not present in ULSI and VLSI integrated circuits manufactured today. For logic, these include sub-threshold effects, output conductance, and power gain of the device. For memory, volatile such as dynamic random access memories (DRAM) and non-volatile such as electrically erasable programmable random access memories ($E^2$PROM), these include sub-threshold conduction which leads to leakage of the stored charge or the loss of the clearly defined threshold. To improve performance and the functionality per unit area, alternatives are needed to the conventional path of scaled designs and technology improvements.

Coulomb blockade is now a conceptually well-understood subject such as described in a publication by H. Matsuoak et al., entitled "Coulomb blockade in the inversion layer of a Si metal-oxide-semiconductor field-effect transistor with a dual gate structure," Appl. Phys. Lett. 64, 586 (1994)

Coulomb blockade is also discussed in a publication by E. H. Nicollian and R. Tsu, entitled "Electrical properties of a silicon quantum dot diode," J. Appl. Phys., 74, 4020 (1993).

A few attempts have been made at making memory structures utilizing Coulomb blockade such as in the publications by K. Yano et al., entitled "A room-temperature single-electron memory device using a fine-grain polycrystalline silicon," Dig. of Int. Electron Dev. Mtg., Dec. 1993, Washington D.C., p. 541 and K. Bock et al., entitled "Proposal for the concept of ultradense integrated memories based on Coulomb blockade at room temperature," Electron. Lett., 29, 2228, (1993).

All the above examples and attempts, however, utilize the conductance effects on in-path conduction of Coulomb blockade.

In a publication by K. K. Likharev et al. entitled "Single Electronics" Scientific American June 1992, pp. 80–85, single-electron tunneling (SET) oscillations through a tunnel junction is described. At page 85, column 1, it recites "In circuits based on single electronics, bits of information can be represented as the presence or absence of individual electrons."

In U.S. Pat. No. 5,055,890 which issued on Oct. 8, 1991 to L. R. Dawson et al., a nonvolatile three dimensional memory is described having a storage channel which stores charge carriers. Charge carriers flow laterally through the storage channel from a source to a drain. The charge may be confined in a compound semiconductor such as GaAs or InAs by a quantum well formed by the different energy band gaps of adjacent layers of for example AlAs or AlSb.

In U.S. Pat. No. 5,347,140 which issued on Sep. 13, 1994 to Y. Hirai et al., an electron transfer device is described which uses alternately disposed quantum dot structures and quantum wire structures and a plurality of electrodes for controlling internal potentials of respective quantum wires and dots and wherein one of the quantum wires and one of the quantum dots adjacent to each other are connected via a potential barrier capable of exhibiting a tunnel effect there between.

SUMMARY OF THE INVENTION

In accordance with the present invention, an apparatus and method for making a storage device for storing k electrons or holes, where k is an integer 0 or greater, indicative of data is described comprising a semiconductor channel, a first insulator layer formed on the semiconductor channel, a nanocrystal (quantum dot) formed on the first insulator, the nanocrystal electrically floating and capacitively coupled to the semiconductor channel by way of Coulomb blockade, a second insulator layer over the nanocrystal, and a gate electrode formed on the second insulator layer.

The invention further provides a memory device having a plurality of nanocrystals spaced apart from one another side by side on the first insulator layer or vertically above one another separated by respective insulator layers.

The invention further provides a memory device including a plurality of nanocrystals spaced apart from one another horizontally and vertically by an insulator material to form a three dimensional array of nanocrystals on the first insulator layer.

The invention further provides an array of storage devices interconnected to form a memory. The memory may be an array of memory devices connected in columns and rows. The drains in a column may be connected to a common column lead or line. The gates in a row may be connected to a common row lead or line. A circuit for detecting current may be connected to a second column lead or line connected to the sources in the column.

The invention further provides a memory device which has discrete threshold voltage shifts for each electron stored in the nanocrystal of the device.

The invention further provides a memory device which stores multi-bit words the value of which corresponds to the number of electrons stored in the nanocrystal of the device.

The invention further provides a memory cell which operates at 23 degrees Centigrade or room temperature.

The invention further provides a drain and source region on opposite sides of the channel for passing current through the channel and for applying potentials to the drain and source regions.

The invention further provides a storage device having Coulomb blockade effects (in a nanocrystal) capacitively coupled to a channel of a field effect transistor for control of the channel.

The invention further provides a storage device having discrete threshold voltages larger than the room temperature (23 C.) thermal voltage (kT/q, 0.0259 Volts) per electron stored.

The invention further includes a method for forming a storage device comprising the steps of selecting an insulating substrate, forming a layer of semiconductor on the substrate, forming a first layer of insulation having a thickness to form an injection insulator, forming a nanocrystal on the first layer of insulation, forming a second layer of insulation on the nanocrystal to function as a control insulator, forming a gate electrode layer on the second layer of insulation, and etching the first layer, nanocrystal, second layer and gate electrode layer to form a gate stack over a region (channel) of the layer of semiconductor.

BRIEF DESCRIPTION OF THE DRAWING

These and other features, objects, and advantages of the present invention will become apparent upon consideration of the following detailed description of the invention when read in conjunction with the drawing in which.

DESCRIPTION OF THE PREFERRED EMBODIMENTS

Figure 1:
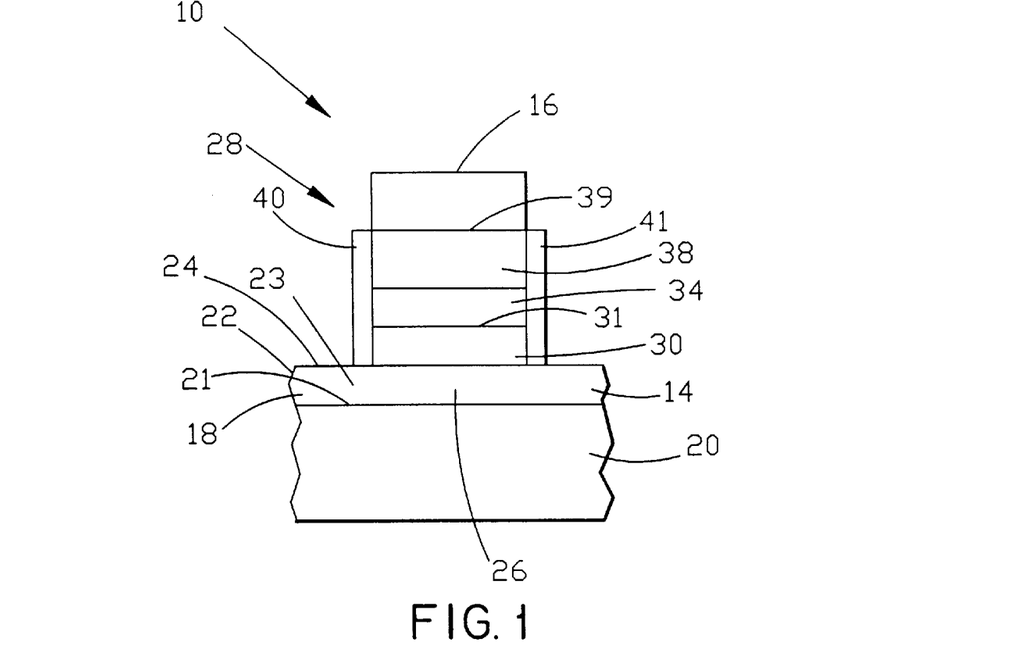
FIG. 1 is a cross section view along the line 1—1 of FIG. 2.
Figure 2:
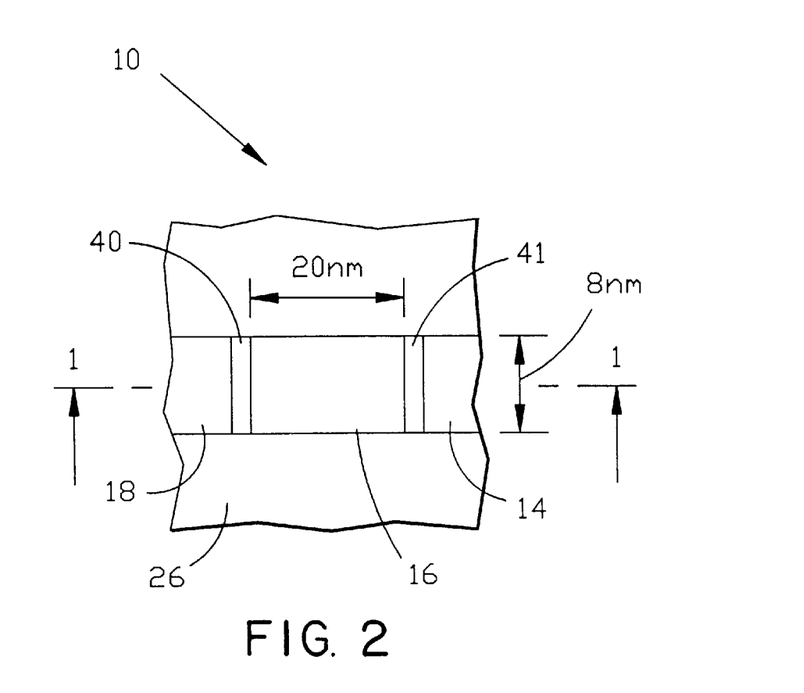
FIG. 2 is a top view of one embodiment of the invention.

Referring now to the drawing, FIG. 1 shows a cross section view along the line 1—1 of FIG. 2 of memory cell or storage device 10 for storing k electrons or holes where k is an integer 0 or greater for example 10 or less per nanocrystal. FIG. 2 shows a top view of memory cell 10 showing drain 14, control gate 16 and source 18. Referring to FIG. 1, substrate 20 may be an insulator such as silicon on insulator (SOI) where the insulator is silicon dioxide etc. having an upper surface 21. Over upper surface 21, a semiconductor layer 22 is formed which may be patterned to form a small island 23 having an upper surface 24 and may be doped p or n type. Semiconductor layer 22 may be for example silicon, silicon germanium, germanium, silicon carbide, gallium arsenide, indium arsenide and other Column IV, III–V, and II–VI elements from the Periodic Table forming semiconductors and semiconductor alloys. Small island 23 is doped n or p type to form two spaced apart regions, drain 14 and source 18. Channel 26 is the region between drain 14 and source 18. The source and drain may be interchangeable as with normal field effect transistors (FETS). Small island 23 and hence channel 26 may have a thickness in the range from 4 to 30 nm.

A gate stack 28 is formed on upper surface 24 which includes a barrier or injection layer 30 having an upper surface 31 which may have a thickness in the range from 1 to 4 nm. Nanocrystal 34 may be, for example, a quantum dot formed over upper surface 31. Nanocrystal 34 functions to store k electrons or holes which are obtained by electrons or holes passing through barrier layer 30. Over nanocrystal 34, a control insulator layer 38 is formed having an upper surface 39. Barrier layer 30 and control insulator layer 38 may have a thickness in the range from 2 to 3 nm. Control insulator layer 38 may be for example silicon oxide, silicon nitride, calcium fluoride and functions as a barrier to electrons or holes in nanocrystal 34. If nanocrystal 34 is GaAs then a wider band gap material such as GaAlAs or GaInAs may be used for barrier layer 30 and control insulator layer 38. Nanocrystal 34 may be a semiconductor from column IV or a semiconductor compound having an element from each of Columns III and V or from columns II–VI of the Periodic Table. Nanocrystal 34 may be one of the same materials suitable for semiconductor layer 22, i.e. silicon, silicon germanium, silicon carbide, gallium arsenide and indium arsenide and other IV, III–V and II–VI semiconductors and semiconductor alloys thereof. Nanocrystal 34 is distinguished from a common or generic layer of semiconductor material in that the nanocrystal is physically confined in three dimensions, each dimension for example height, width and depth being equal to or less than 40 nm.

Spacers 40 and 41 are formed of an insulating material such as silicon nitride or silicon oxide and may be placed on either side of gate stack 28 and preferably on all sides of gate stack 28 to provide a barrier to electrons or holes in nanocrystal 34.

Nanocrystal 34 using the principle of Coulomb blockade is capacitively coupled to channel 26 of memory cell 10. Memory cell 10 exhibits discrete threshold voltages which can be made much larger than the room temperature thermal voltage $V_T$ as shown in Equation 1.

$$V_T = \frac{kT}{q} = 0.0259 \text{ Volts} \qquad (1)$$

In equation 1, T is the temperature in degrees kelvin, k is the Boltzmann constant and q is the electron or hole charge. The discrete threshold voltages which are larger than the room temperature thermal voltage are feasible when channel 26 dimensions are of the order of 30 nm in channel length and width and improves with further reduction in dimensions.

In the absence of an electron or hole in nanocrystal 34 wherein nanocrystal 34 is embedded in the control gate structure or gate stack 28, memory cell 10 exhibits a classical threshold voltage determined by considerations of inducing an inversion-based conducting channel in channel 26 of island 23. For a silicon channel, these considerations are well known at dimensions greater than 0.25 micrometers, and require some modification to incorporate short-channel, tunneling, and quasi-ballistic effects. By constricting or limiting channel 26 in all three dimensions such as by silicon on insulator (SOI), sub-threshold current effects are reduced.

In FIGS. 1 and 2, channel 26 of a small thickness and of silicon is controlled by nanocrystal 34 in gate stack 28. Insulator 30 of silicon oxide may be, for example, 2.5 nm thick and may be in the range from 2 to 3 nm thick. Nanocrystal 34 may be a 1 to 2 nm thick silicon quantum dot. Control insulator 38 of silicon oxide may be, for example, 2.5 nm thick and may be in the range from 2 to 3 nm thick. Control gate 16 may be polysilicon.

The natural threshold voltage of memory cell 10, $V_{th}$, is of the order of 0.2 Volts. One electron or hole may be injected into nanocrystal 34, or quantum dot, by applying a positive or negative voltage bias respectively to the gate with respect to source 18 and drain 14. Alternately, the source and/or drain voltage may be raised to inject an electron or hole into nanocrystal 34. Due to the presence of an electron or hole in nanocrystal 34 or a change in the number of electrons or holes in the nanocrystal 34, the threshold voltage shifts, and its magnitude is given in Equation 2.

$$\Delta V_{th} = \frac{q}{C_g} \qquad (2)$$

In Equation 2, $C_g$ is the gate capacitance to the channel and q is the magnitude of the electron charge. The magnitude of the gate capacitance is given by Equation 3.

$$C_g = \frac{\epsilon A}{t} \qquad (3)$$

In Equation 3, epsilon is the dielectric constant, A is the area, and t is the thickness of layers 30 and 38.
By inserting typical values in Equation 3, the capacitance $C_g$ is given as shown in Equation 4.

$$= \frac{8.86 \times 10^{-14} \times 4 \times 80 \times 10^{-8} \times 200 \times 10^{-8}}{60 \times 10^8} = 9.45 \times 10^{-19} \text{ F} \qquad (4)$$

The resulting threshold shift is given by Equation 5.

$$\Delta V_{th} = \frac{1.6 \times 10^{-19}}{9.45 \times 10^{19}} = 0.17 \text{ V} \qquad (5)$$

The voltage of 0.17 volts from Equation 5 is large compared to the thermal voltage given in Equation 1 as 0.0259 Volts and can be detected or sensed electrically. The electron or hole charge does not leak out once it is placed in nanocrystal 34 because the electrostatic energy associated with the electron charge in nanocrystal 34 is high. The electrostatic energy is given by Equation 6.

$$U = \frac{q^2}{2C_t} = 0.042 \text{ eV} \qquad (6)$$

In Equation 6, $C_t$ is the nanocrystal 34 capacitance to channel 26 determined by the barrier thickness of barrier layer 30. The energy given by Equation 6 is significantly larger than the room temperature thermal energy. Therefore, an electron or hole that is placed in nanocrystal 34 does not leak out unless sufficient bias voltage is applied to provide the energy for its removal.

The nano-structure memory device as shown in FIG. 1 allows for storage of more than one electron or hole in memory cell 10, each electron or hole in nanocrystal 34 will cause the threshold voltage of memory cell 10 to shift by about 0.17 Volts as given in the example in Equations 4 and 5. Thus storing 10 electrons or holes would cause a threshold voltage shift of 1.7 volts. As described, a major attribute of this device is that it can store a 2 or more bit wide word within one memory cell as a function of the number of electrons stored and lead to a remarkable increase in the bit packing density. Of course, the read/write electronics associated with the memory cell and the corresponding sense amplifier circuits would also have to have a corresponding resolution to detect 0.17 volt increments.

Figure 3:
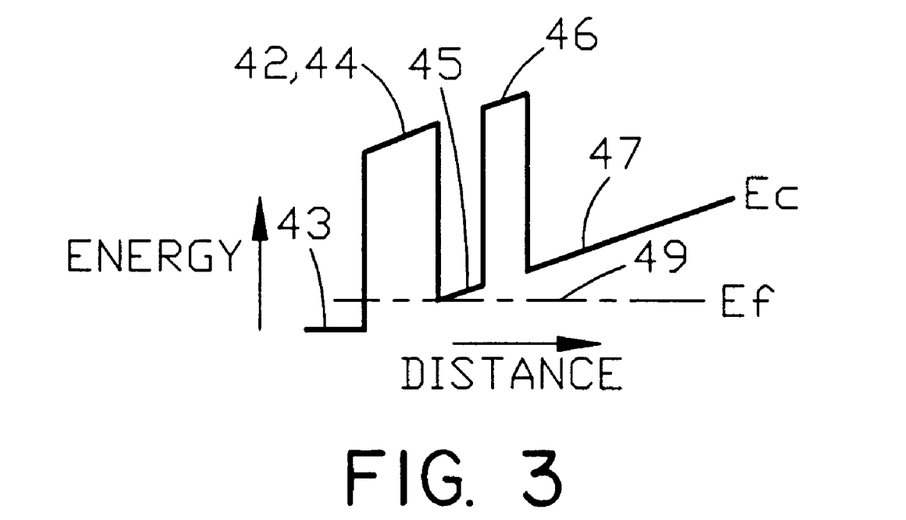
FIG. 3 is a graph showing the energy of an electron at the bottom of the conduction band as a function of vertical distance through the embodiment shown in FIG. 1 for the case where no electron is stored in the nanocrystal.

FIG. 3 is a graph showing the energy of an electron at the bottom of the conduction band as a function of distance below gate 16 of memory cell 10 without storing an electron in nanocrystal 34. In FIG. 3, the ordinate represents energy of a single electron at the bottom of the conduction band and the abscissa represents distance below gate 16. Reference line 49 in FIG. 3 represents the Fermi energy $E_F$. Curve 42 shows the conduction band energy. Curve portion 43 shows the energy of control gate 16. Curve portion 44 shows the energy of control insulator 38. Curve portion 45 shows the energy of nanocrystal 34 when no electron is stored therein. Curve portion 46 shows the energy of barrier insulator 30. And, curve portion 47 shows the energy of channel 26. As shown by curve portion 45, nanocrystal 34 is empty of an electron. An electron would have to over come the insulator barrier energy shown by curve portions 42 and 46 to reach or be injected into nanocrystal 34.

Figure 4:
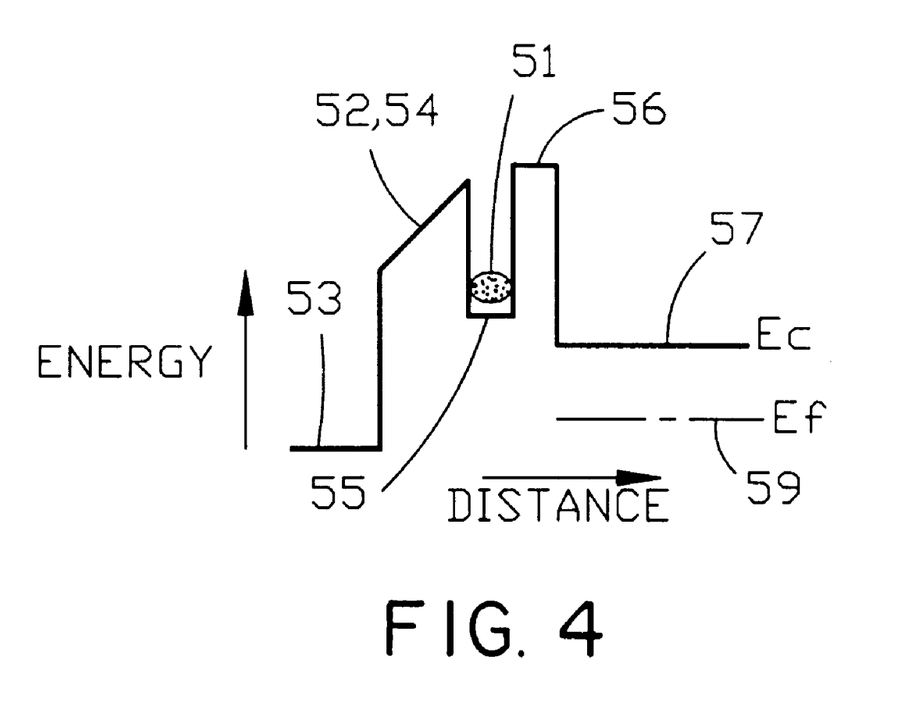
FIG. 4 is a graph showing the energy of an electron at the bottom of the conduction band as a function of vertical distance through the embodiment shown in FIG. 1 for the case where one electron is stored in the nanocrystal.

FIG. 4 is a graph showing the energy of an electron at the bottom of the conduction band as a function of distance through memory cell 10 with one electron stored in nanocrystal 34. In FIG. 4, the ordinate represents the energy of a single electron at the bottom of the conduction band and the abscissa represents distance below gate 16. Reference line 59 represents the Fermi energy $E_F$. Curve 52 shows the conduction band energy. Curve portion 53 shows the energy of control gate 16. Curve portion 54 shows the energy of control insulator 38. Curve portion 55 shows the energy of nanocrystal 34 with one electron 51 stored therein. Curve portion 56 shows the energy of barrier insulator 30. And, curve portion 57 shows the energy of channel 26. As shown by curve portion 55, nanocrystal 34 has a higher energy with one electron stored therein than curve portion 45 shown in FIG. 3. Curve portions 54 and 56 show that there is an energy barrier on either side of curve portion 55 to prevent electrons from entering or leaking into or out of nanocrystal 34. Curve portion 57 represents the conduction band edge energy in channel 26 in memory cell 10.

Figure 5:
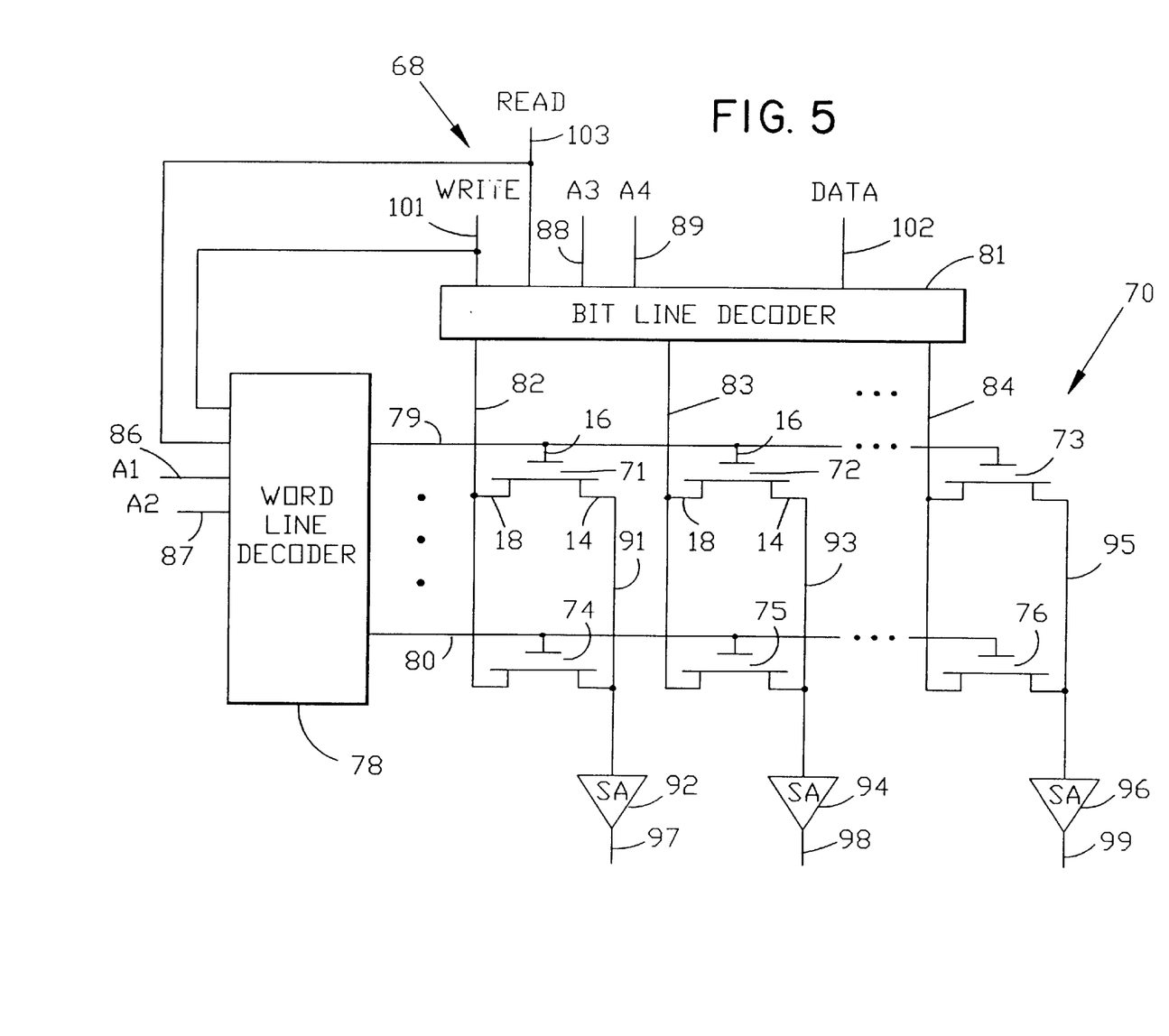
FIG. 5 is a second embodiment of the invention which may utilize a plurality of respective embodiments shown in FIGS. 1 and 6–9.

FIG. 5 is a schematic diagram of memory 68 which includes an array 70 of storage devices 71–76 which may be positioned to form rows and columns. In FIG. 5, like references are used for functions corresponding to the apparatus of FIGS. 1 and 2. Storage devices 71–76 may be the same as storage device 10 shown in FIGS. 1 and 2 or memory cells 104, 114, and 128 shown in FIGS. 6–9. Memory 68 may be interconnected to form a random access memory (RAM) as shown in FIG. 5. Memory 68 may also be a read only memory (ROM) by disabling the write mode after writing in the data. In FIG. 5, word line decoder 78 is coupled to word lines 79 and 80 and bit line decoder 81 is coupled to bit lines 82–84. Address signals A1 and A2 on lines 86 and 87 are coupled to word line decoder 78 and address signals A3 and A4 on lines 88 and 89 are coupled to bit line decoder 81. Word line 79 is coupled to gate 16 of storage devices 71–73. Word line 80 is coupled to gate 16 of storage devices 74–76. Bit line 82 is coupled to source 18 of storage devices 71 and 74. Bit line 83 is coupled to source 18 of storage devices 72 and 75. Bit line 84 is coupled to source 18 of storage devices 73 and 76. Sense line 91 is coupled to drain 14 of storage devices 71 and 74 and to an input of sense amplifier 92. Sense line 93 is coupled to drain 14 of storage devices 72 and 75 and to an input of sense amplifier 94. Sense line 95 is coupled to drain 14 of storage devices 73 and 76 and to an input of sense amplifier 96. Sense amplifiers 92, 94 and 96 function to detect the voltage or current on sense lines 91, 93, and 95, respectively and provide an output on lines 97–99, respectively.

In operation of memory 68 to write data into memory 68, address signals A1–A4 on lines 86–89 are activated to select a word line such as word line 79 and a bit line such as bit line 83. When signal WRITE goes high on line 101, the voltage on word line 79 goes to a first voltage. The voltage on bit line 83 goes to a first or second voltage depending on whether the data to be written on lead 102 is a one or zero. The voltage between lines 79 and 83 are such as to cause one or a certain number of electrons or holes to tunnel through barrier 30 into or out of nanocrystal 34 of storage device 72. The voltage on lines 82 and 84 with respect to line 79 are insufficient to cause an electron or hole to tunnel into or out of nanocrystal 34 of storage devices 71 and 73. The voltage on lines 82–84 with respect to line 80 are insufficient to cause an electron or hole to tunnel into or out of nanocrystal 34 of storage devices 74–76.

In operation of memory 68 to read data from memory 68, address signals A1–A4 on lines 86–89 are activated or addressed. A word line is selected such as word line 79 by placing a first voltage thereon. Then, Read signal on lead 103 goes high. Bit lines 82–84 go to a first voltage such as 2.0 v volts. The voltage or current on leads 91, 93, and 95 is sensed by sense amplifiers 92, 94, and 96 to provide output signals on leads 97–99, respectively, indicative of the number of electrons stored in nanocrystals 34 of storage devices 71–73.

Figure 6:
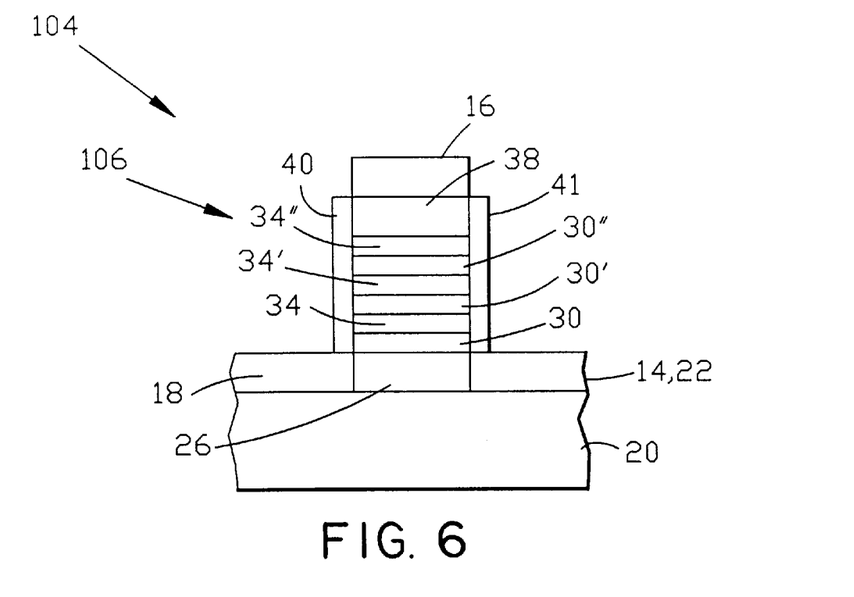
FIG. 6 is a cross section view of a third embodiment of the invention.

FIG. 6 shows a cross section view of memory cell 104 wherein gate stack 106 has a plurality of nanocrystal layers 34, 34', and 34" spaced apart and positioned vertically above one another over respective barrier layers 30, 30', and 30" between channel 26 and control insulator layer 38. In FIGS. 6–9, like references are used for functions corresponding to the apparatus of FIGS. 1, 2 and 6–8 which precede it. By applying a bias voltage between channel 26 and gate 16, individual electrons or holes may be inserted or removed from respective nanocrystals 34, 34' and 34".

Furthermore, electrons or holes may be moved from one nanocrystal to another to provide an increasing increment or a decreasing decrement of threshold voltage indicative of data stored in memory cell 104.

Figure 7:
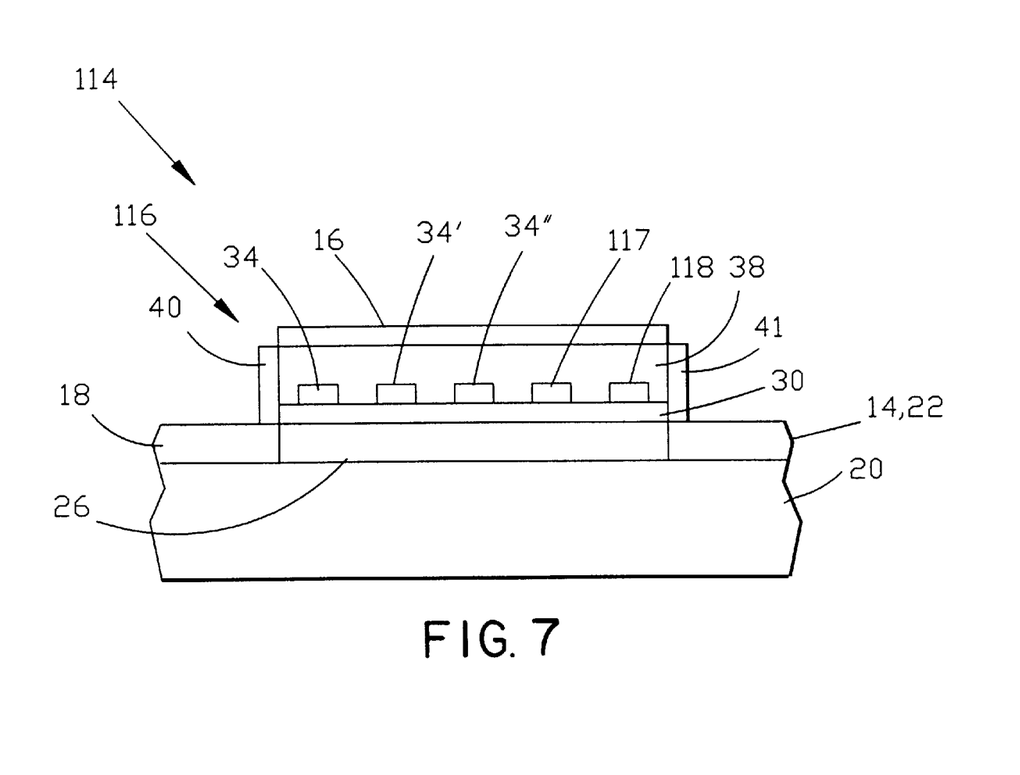
FIG. 7 is a cross section view of a fourth embodiment of the invention.

FIG. 7 shows a cross section view of memory cell 114 wherein gate stack 116 has a plurality of nanocrystals 34, 34', 34", 117 and 118 spaced apart and positioned horizontally or side by side to form a one or two dimensional array of nanocrystals 34, 34', 34", 117 and 118 between barrier layer 30 and control insulator layer 38. By applying a bias voltage between channel 26 and gate 16, electrons or holes may be inserted, injected into or removed from nanocrystals 34, 34', 34", 117 and 118.

Figure 8:
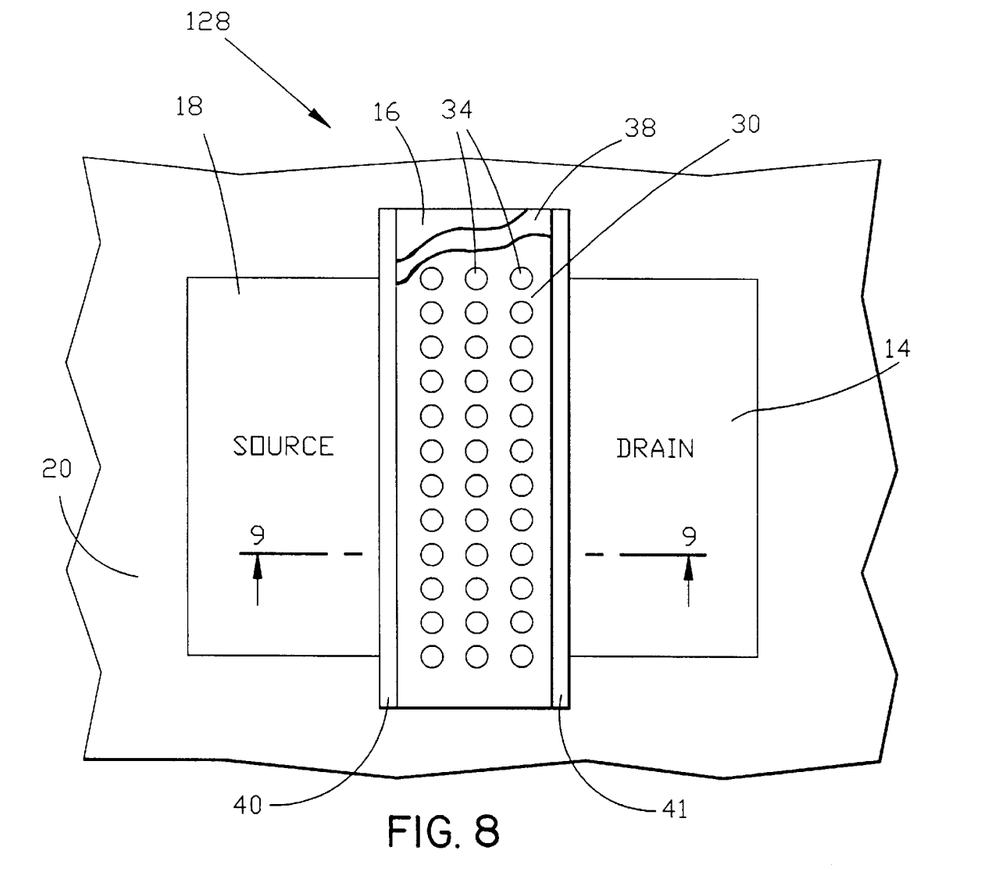
FIG. 8 is a top view of a fifth embodiment of the invention.
Figure 9:
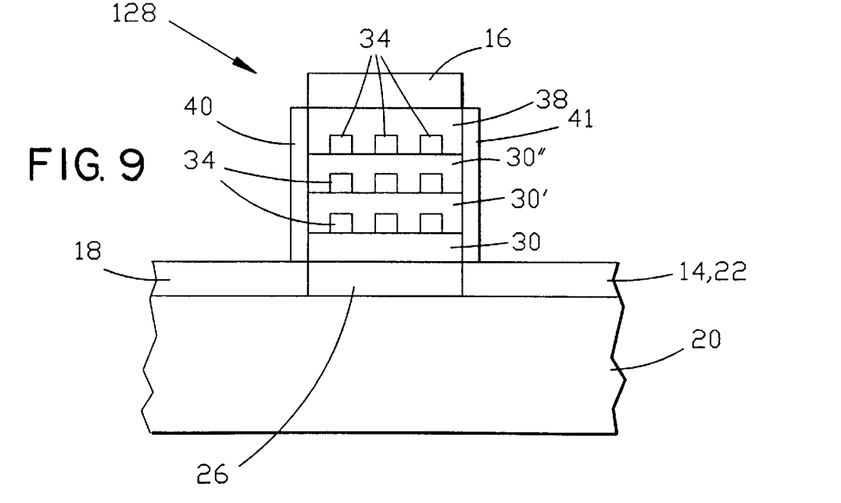
FIG. 9 is a cross section view along the line 9—9 of FIG. 8.

FIG. 8, shows a top view of memory cell 128 wherein a two or three dimensional array of spaced apart nanocrystals 34 may be positioned between barrier layer 30 and control insulator layer 38 in a single layer as shown in FIG. 7 or in a plurality of layers as shown in FIG. 9.

FIG. 9 shows a cross section view along the line 9—9 of FIG. 8. In FIG. 9, a plurality of two dimensional arrays of spaced apart nanocrystals with barrier layers 30, 30' and 30" therebetween is shown. In FIG. 8, gate 16 may have dimensions of 0.4 $\mu$m by 20 $\mu$m. Nanocrystals or quantum dots 34 in one of the two dimensional arrays may have a density of $10^{12}$ cm$^{-2}$.

Figure 10:
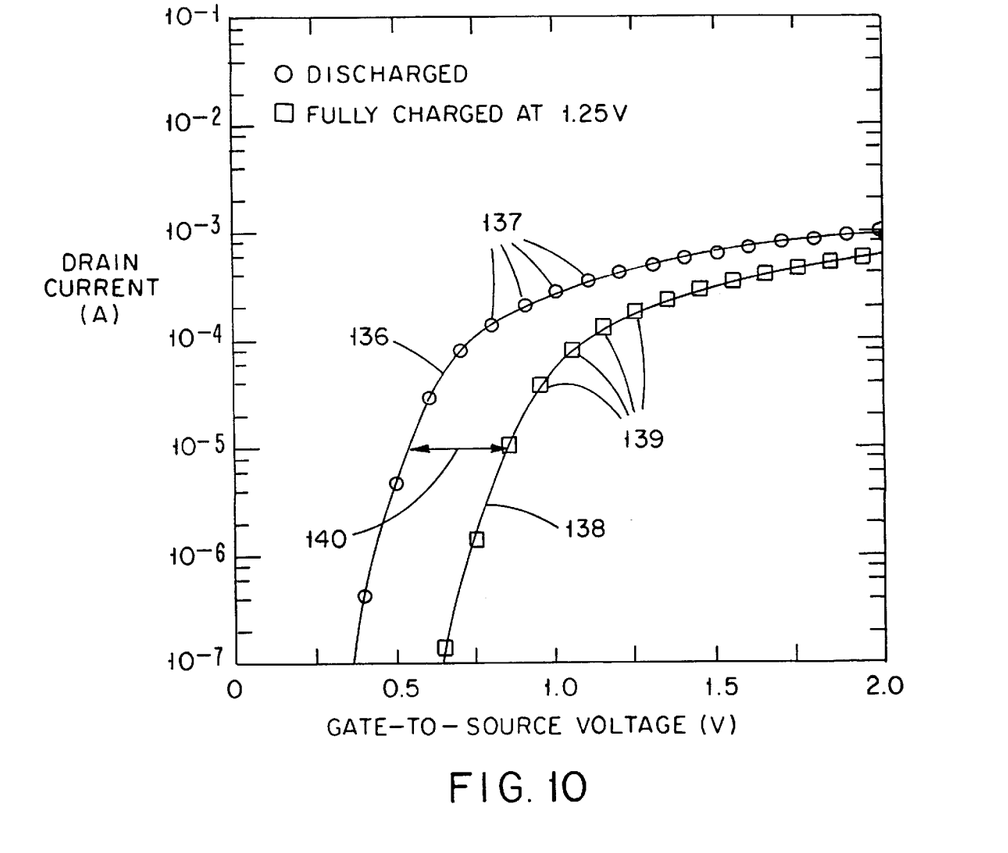
FIG. 10 is a graph of the drain current versus gate-to-source voltage of the embodiment shown in FIGS. 8 and 9.

FIG. 10 is a graph of measurements taken in the laboratory of the drain current versus gate-to-source voltage of memory cell 128 shown in FIG. 8. In FIG. 10, the ordinate represents drain current and the abscissa represents gate-to-source voltage. The measurements were made with memory cell 128 at 300 K. Curve 136 interconnects data points shown by circles 137 for memory cell 128 with nanocrystals 34 fully discharged or without electrons. Curve 138 interconnects data points shown by squares 139 for memory cell 128 with nanocrystals 34 fully charged with electrons which was accomplished by applying 1.25 volts between channel 26 (via source 18 or drain 14) and gate 16. A shift of the voltage for a drain current of 10 $\mu$Amps was about 0.255 volts as shown by arrow 140 in FIG. 10.

Figure 11:
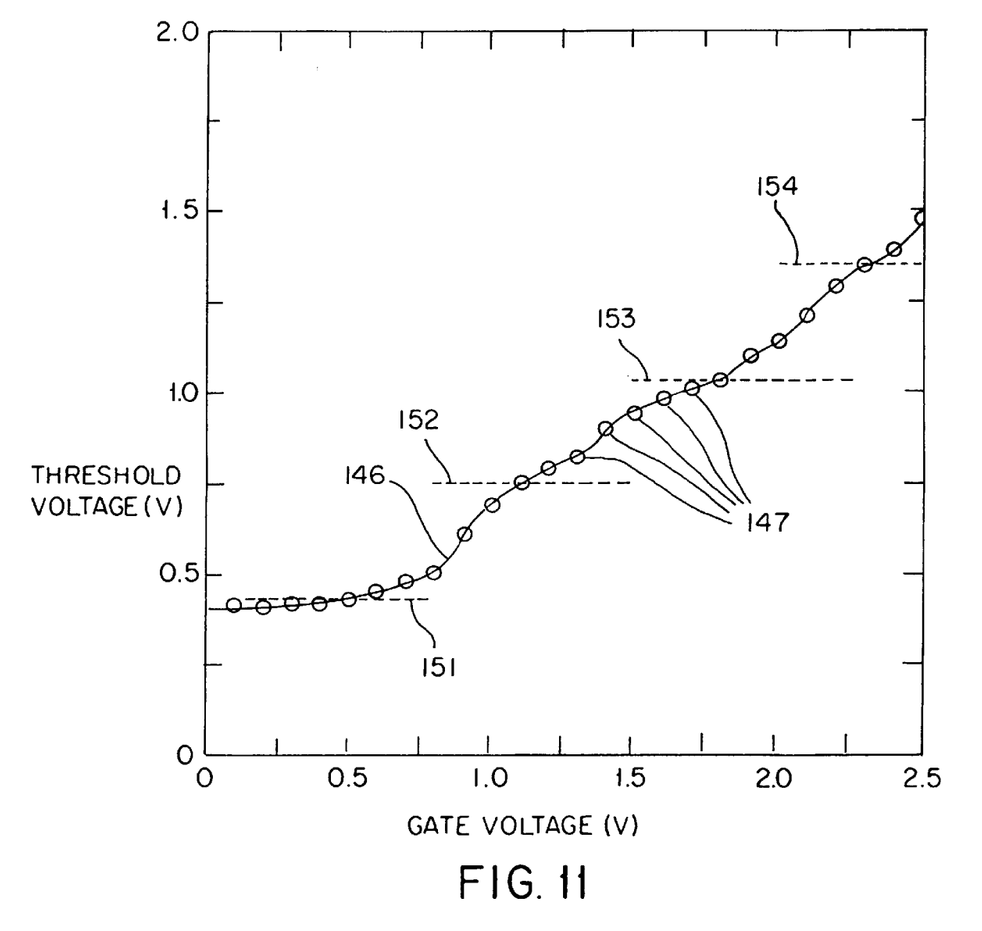
FIG. 11 is a graph of the threshold voltage versus gate voltage of the fifth embodiment shown in FIGS. 8 and 9.

FIG. 11 is a graph of measurements taken in the laboratory of the threshold voltage versus gate voltage of memory cell 128 shown in FIGS. 8 and 9. In FIG. 11, the ordinate represents threshold voltage and the abscissa represents gate voltage. The measurements were made with memory cell 128 at 77 K. Curve 146 interconnects data points shown by circles 147. Reference lines 151–154 represent the threshold voltage of memory cell 128 as a function of zero through three electrons stored in respective nanocrystals 34.

Figure 12:
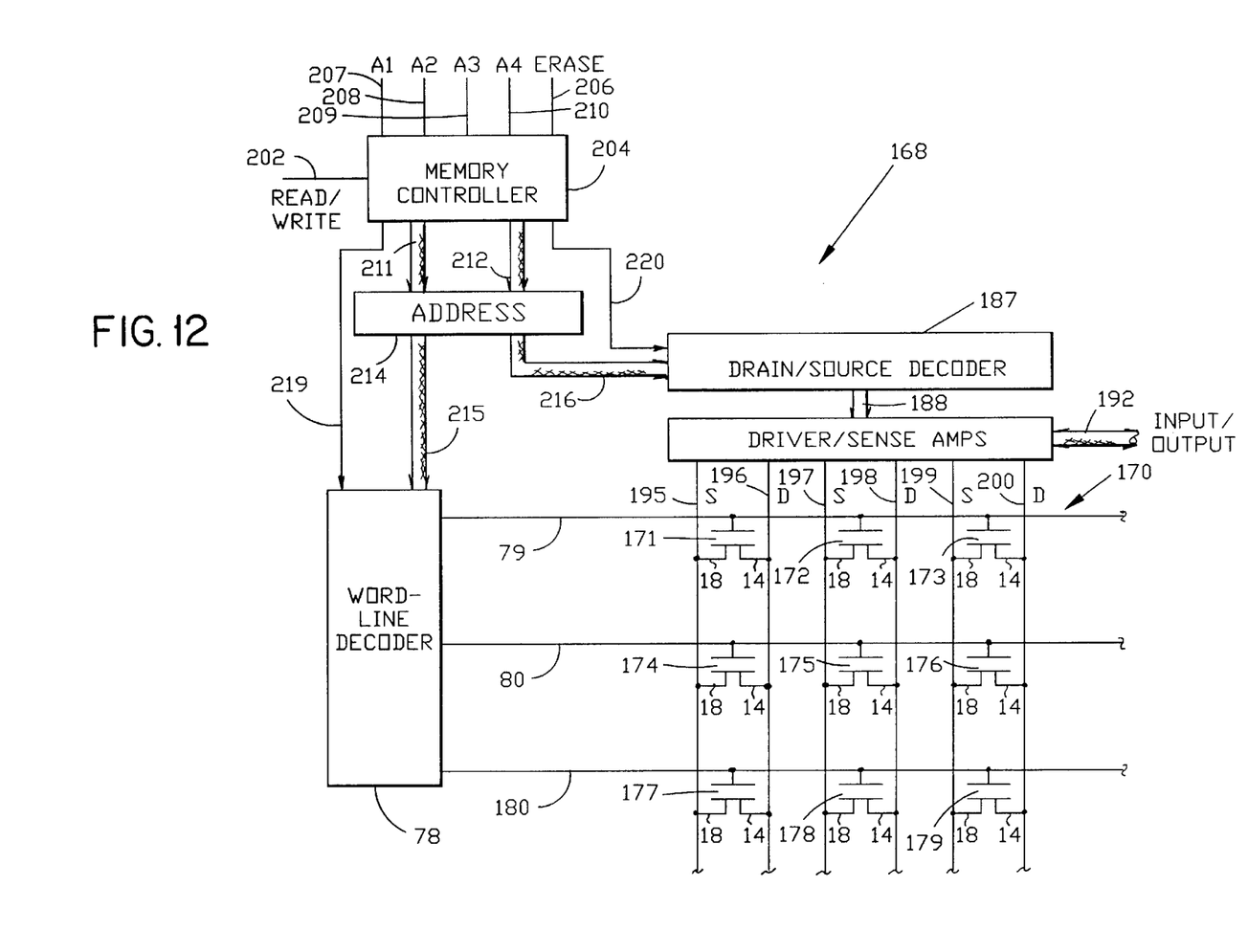
FIG. 12 is a sixth embodiment of the invention which may utilize a plurality of respective embodiments shown in FIGS. 1 and 6–9.

FIG. 12 is a schematic diagram of memory 168 which includes an array 170 of storage devices 171–179 which may be positioned to form rows and columns. In FIG. 12 like references are used for functions corresponding to the apparatus of FIGS. 1, 5–9. Storage devices 171–179 may be the same as storage device 10 shown in FIGS. 1 and 2 or memory cells 104, 114, and 128 shown in FIGS. 6–9. Memory 168 may be interconnected to form a random access memory as shown in FIG. 12.

In FIG. 12, word line decoder 78 is coupled to word lines 79, 80 and 180. Drain/Source Decoder 187 is coupled over lead 188 to Driver/Sense Amplifiers 190. Driver/Sense Ampliers 190 has a data input/output lead 192. The source of storage devices 171, 174, and 177 is coupled over lead 195 to Driver/Sense Amplifier 190. The drain of storage devices 171, 174, and 177 is coupled over lead 196 to Driver/Sense Amplifier 190. The source of storage devices 172, 175, and 178 is coupled over lead 197 to Driver/Sense Amplifier 190. The drain of storage devices 172, 175, and 178 is coupled over lead 198 to Driver/Sense Amplifier 190. The source of storage devices 173, 176, and 179 is coupled over lead 199 to Driver/Sense Amplifier 190. The drain of storage devices 173, 176, and 179 is coupled over lead 200 to Driver/Sense Amplifier 190.

With the source and drain of each storage device in array 170 connected on leads to Driver/Sense Amplifier 190, the potential on the source and drain may be shorted together or may each have respective potentials thereon. Current through storage devices 171–179 may be detected by Driver/ Sense Amplifier 190 with the gate at a first potential, the source at a second potential and the drain at a third potential. The gates of non selected storage devices in non selected rows may be at a fourth potential where no current flows through the respective storage devices.

A control signal Read/Write is coupled on lead 202 to an input of memory controller 204. An Erase signal is coupled over lead 206 to a second input of memory controller 204. Address signals A1–A4 are coupled over leads 207–210 to memory controller 204 which are coupled over leads 211 and 212 to Address Driver 214. Address Driver 214 is coupled over lead 215 to Wordline Decoder 78. Address Driver 214 is coupled over lead 216 to Drain/Source Decoder 187. Memory Controller 204 is coupled to Wordline Driver 78 by way of lead 219 for coupling control signals, Write, Read and Erase. Memory Controller 204 is coupled to Drain/Source Decoder 187 by way of lead 220 for coupling control signals Write, Read and Erase.

While there has been described and illustrated a memory cell containing one or more nanocrystals or quantum dots and a memory containing the memory cells, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. A method for forming a memory device comprising the steps of:

selecting a substrate, forming a layer of semiconductor material on said substrate, forming a first layer of insulation having a thickness to form an injection insulator, forming a nanocrystal on said first layer of insulation, forming a second layer of insulation on said nanocrystal to function as a control insulator, forming a gate electrode layer on said second layer of insulation, and etching said first layer, nanocrystal, second layer and gate electrode layer to form a gate stack over a channel region of said layer of semiconductor material.

2. The method of claim 1 wherein said step of forming a nanocrystal includes the step of forming a plurality of nanocrystals spaced apart from one another on said first layer of insulation.

3. The method of claim 2 wherein said step of forming a nanocrystal includes the step of forming a plurality of nanocrystals spaced apart from one another in an insulator material to form a three dimensional array of nanocrystals on said first layer of insulation.

* * * * *